(12) United States Patent
Ono et al.

(10) Patent No.: US 10,903,059 B2
(45) Date of Patent: Jan. 26, 2021

(54) FILM FORMATION APPARATUS

(71) Applicant: SHIBAURA MECHATRONICS CORPORATION, Yokohama (JP)

(72) Inventors: Daisuke Ono, Yokohama (JP); Yu Kambe, Yokohama (JP)

(73) Assignee: SHIBAURA MECHATRONICS CORPORATION, Yokohama (JP)

(*) Notice: Subject to any disclaimer, the term of this patent is extended or adjusted under 35 U.S.C. 154(b) by 92 days.

(21) Appl. No.: 16/123,709

(22) Filed: Sep. 6, 2018

(65) Prior Publication Data

US 2019/0074167 A1 Mar. 7, 2019

(30) Foreign Application Priority Data

Sep. 7, 2017 (JP) ................................. 2017-172504

(51) Int. Cl.
| | | |
|---|---|---|
| C23C 14/34 | (2006.01) | |
| H01J 37/34 | (2006.01) | |
| H01J 37/32 | (2006.01) | |
| C23C 14/00 | (2006.01) | |
| C23C 14/50 | (2006.01) | |

(Continued)

(52) U.S. Cl.
CPC ...... *H01J 37/3488* (2013.01); *C23C 14/0078* (2013.01); *C23C 14/08* (2013.01); *C23C 14/34* (2013.01); *C23C 14/505* (2013.01); *H01J 37/32513* (2013.01); *H01J 37/32651* (2013.01); *H01J 37/32733* (2013.01); *H01J 37/32779* (2013.01); *H01J 37/34* (2013.01); *H01J 37/347* (2013.01); *H01J 37/3441* (2013.01); *H01L 21/68764* (2013.01); *H01L 21/68771* (2013.01);

(Continued)

(58) Field of Classification Search
CPC ...................... H01J 37/32513; H01J 37/32651
See application file for complete search history.

(56) References Cited

U.S. PATENT DOCUMENTS 4,692,233 A * 9/1987 Casey .................. C23C 14/562
 118/718
5,863,170 A * 1/1999 Boitnott .............. H01L 21/6719
 204/298.25

(Continued)

FOREIGN PATENT DOCUMENTS

| JP | 59-157281 A | 9/1984 |
|---|---|---|
| JP | 9-235668 A | 9/1997 |

(Continued)

*Primary Examiner* — Jason Berman
(74) *Attorney, Agent, or Firm* — Nath, Goldberg & Meyer; Jerald L. Meyer

(57) ABSTRACT

A film formation apparatus includes a chamber which has an interior capable of being vacuumed, and which includes a lid that is openable and closable on the upper part of the chamber, a rotation table which is provided in the chamber and which and carries a workpiece in the circular trajectory, a film formation unit that deposits film formation materials by sputtering on the workpiece carried by the rotation table to form films, a shielding member which is provided with an opening at the side which the workpiece passes through, and which forms a film formation room where the film formations by the film formation units are performed, and a support which supports the shielding member, and which is independent relative to the chamber and is independent from the lid.

9 Claims, 16 Drawing Sheets

(51) Int. Cl.
    *H01L 21/687*     (2006.01)
    *C23C 14/08*     (2006.01)
    *H01L 21/02*     (2006.01)
    *H01L 21/285*     (2006.01)

(52) U.S. Cl.
    CPC .. *H01L 21/02244* (2013.01); *H01L 21/02252* (2013.01); *H01L 21/2855* (2013.01)

(56) References Cited

U.S. PATENT DOCUMENTS

2007/0209926 A1     9/2007   Lee et al.
2016/0307782 A1*  10/2016  Weaver ............ H01L 21/67115

FOREIGN PATENT DOCUMENTS

| | | |
|---|---|---|
| JP | 4428873 B2 | 3/2010 |
| JP | 2013-147711 A | 8/2013 |
| KR | 10-2012-0004345 A | 1/2012 |

\* cited by examiner

FILM FORMATION APPARATUS

CROSS-REFERENCE TO RELATED APPLICATION

This application is based upon and claims the benefit of priority from Japan Patent Application No. 2017-172504, filed on Sep. 7, 2017, the entire contents of which are incorporated herein by reference.

FIELD OF THE INVENTION

The present disclosure relates to a film formation apparatus.

BACKGROUND

In manufacturing process of various products, such as a semiconductor element, a liquid crystal display, and an optical disk, a thin film like an optical film is formed on a workpiece, such as a wafer or a glass substrate. This thin film is formed by repeating film formation of forming a metal film, etc., on the workpiece, and film processing, such as etching, oxidization, or nitridation to the formed film.

Film formation and film processing can be performed in various schemes, and one example scheme is utilizing plasma. In film formation, an inert gas is introduced into a chamber that is a vacuum container in which a target is placed, and a DC voltage is applied to the target. Ions of the plasma inert gas are bombarded to the target, and material beaten out from the target are deposited on a workpiece to form a film. In film processing, a process gas is introduced into a chamber in which an electrode is placed, and a high-frequency voltage is applied. Ions of the plasma process gas are bombarded to the film on the workpiece to perform film processing.

In order to sequentially perform the film formation and the film processing, a film formation apparatus including rotation table installed inside a chamber, and a plurality of film formation units and film processing units provided to the ceiling of the chamber is known. According to this structure, a workpiece is held on the rotation table and carried to pass through the spaces right below the film formation unit and the film process unit, forming an optical film, etc.

In the above film formation apparatus, the ceiling of the chamber which the film formation unit and the film process unit are provided is constituted as a part of an openable and closable lid. That is, the film formation unit and the film process unit are provided to be freely detachable from the chamber together with the lid. Moreover, a film formation room is formed at a position corresponding to the film formation unit in the chamber by shielding members. The film formation room is provided, for example, to prevent a film formation material from the target from dispersing and sticking to the internal wall of the chamber, or to prevent the introduced inert gas from leaking. Hence, the shielding member is fixed to the lid of the chamber together with the target provided to the lid of the chamber. The edge of the shielding member is located near the workpiece with a clearance that enables the workpiece to pass through. It is preferable that the clearance between the shielding member and the workpiece is as small as possible in order to reduce the leakage of the film formation material and the inert gas as much as possible. For example, the clearance between the edge of the shielding member and the workpiece is set to several mm.

However, at the time of the vacuuming of the interior of the chamber, the lid is bent downwardly by atmospheric pressure. This changes the clearance between the shielding member and the workpiece which are provided on the lid. Hence, it is necessary to close the lid and adjust the height of the shielding member beforehand so that the shielding member does not contact the workpiece at the time of vacuuming, and the clearance is maintained. However, it is difficult to adjust the height of the shielding member while assuming where the position the shielding member attached to the lid takes relative to the workpiece when the lid is closed.

Moreover, the entire size of the film formation apparatus is increasing due to a request for simultaneously processing a large number of semiconductor elements and for processing a large-size display. For example, some chambers have a diameter that exceeds 1 m. Since lids of such chambers need to be relatively thick to suppress the bend due to own weight, the weight thereof increases. In this case, it is necessary to also thicken the shielding member and enhance the rigidity to suppress a deformation due to stress of the film due to the sticking film formation material, and the thermal deformation at the time of sputtering. Accordingly, the upper part of the chamber further increases the weight.

The work of attaching this shielding member having an increased weight to the lid of the chamber cannot be carried out by a single worker, and a plurality of workers are required. Moreover, since workers need to enter inside the chamber to carry out such works, and the works take a lot of efforts. Furthermore, when the lid and the shielding member are heavy, it becomes further difficult to frequently repeat attaching and detaching of the lid from the chamber to adjust the clearance between the shielding member and the workpiece.

An objective of the present disclosure is to provide a film formation apparatus that can easily and precisely set a clearance between a shielding member and a workpiece.

SUMMARY OF THE INVENTION

In order to accomplish the above objective, a film formation apparatus according to the present disclosure includes:

a chamber which has an interior capable of being vacuumed, and which comprises a lid that is openable and closable on an upper part of the chamber;

a carrying unit which is provided in the chamber and which carries a workpiece in a circular trajectory;

a film formation unit that deposit a film formation material by sputtering on the workpiece carried by the carrying unit to form a film;

a shielding member which is provided with an opening at a side which the workpiece passes through, and which forms a film formation room where the film formation by the film formation unit is performed; and a support which supports the shielding member, and which is immovable relative to the chamber and independent from the lid.

The support may include an outer-circumference support that supports the shielding member at an outer circumference side of the rotation of the carrying unit, and an inner-circumference support that supports the shielding member at an inner circumference side of the rotation of the carrying unit.

The film formation apparatus may include a first vibration absorber provided between the shielding member and the support.

The film formation apparatus may include a second vibration absorber provided between the shielding member and the lid.

The film formation apparatus may include a heat dissipating member provided between the shielding member and the lid.

The shielding member may include a ceiling attached to the lid, and a side surface provided separately from the ceiling.

The film formation apparatus may include an adjusting member which is freely detachably attached to the shielding member, and which adjusts a clearance between the shielding member and the workpiece.

The adjusting member may include a combination of a plurality of divided components. The film formation apparatus may include a correction plate which is freely detachably attached to the shielding member, and which adjusts a film thickness distribution of a film to be formed.

According to the present disclosure, a film formation apparatus which can easily and precisely set a clearance between a shielding member and a workpiece can be provided.

DETAILED DESCRIPTION OF THE EMBODIMENTS

[Structure]

Figure 1:
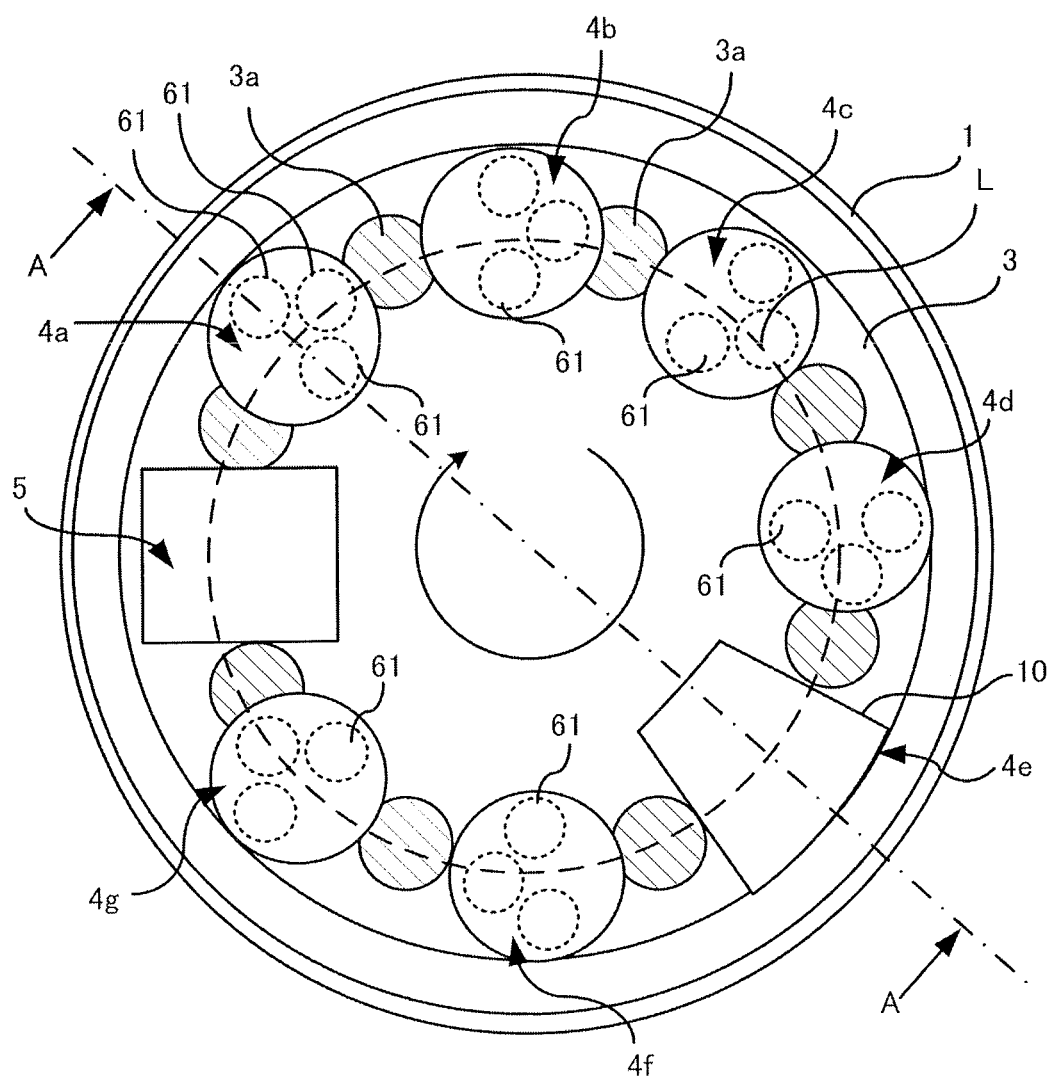
FIG. 1 is a transparent plan view schematically illustrating a structure of a film formation apparatus according to an embodiment.
Figure 2:
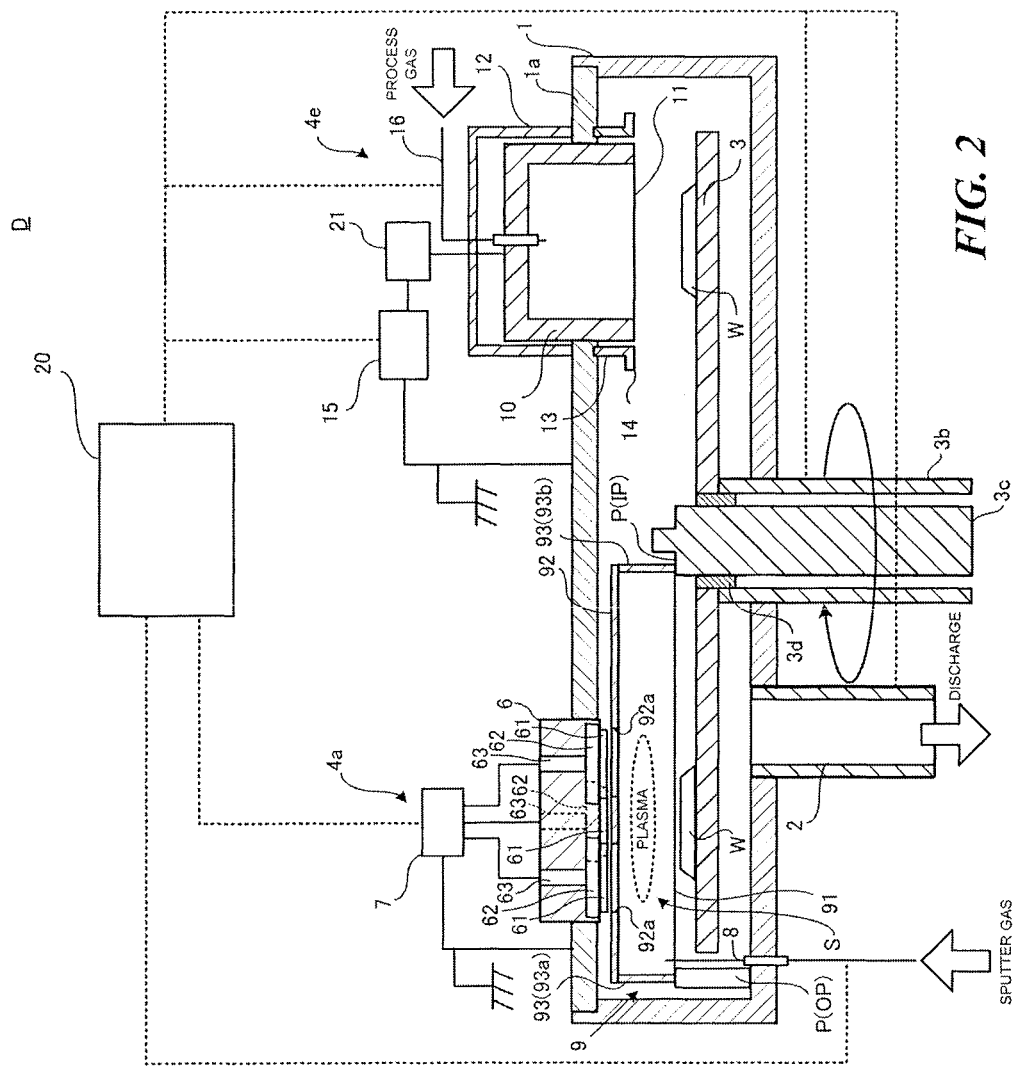
FIG. 2 is a cross-sectional view along a line A-A in FIG. 1.

An embodiment of the present disclosure will be described in detail with reference to the figures. As illustrated in FIG. 1 and FIG. 2, a film formation apparatus D includes a chamber 1. The chamber 1 is a container with a substantially cylindrical shape and a bottom. The chamber 1 have an interior capable of being vacuumed, and includes a lid 1a that can open and close the upper part. The lid 1a is a plate component in a circular shape, and gas-tightly seals the upper part of the chamber 1. Moreover, the chamber 1 is provided with a discharging unit 2, and the interior of the chamber 1 can be discharged to be vacuum. That is, the chamber 1 functions as a vacuum container.

In the chamber 1, a rotation table 3 that is a carrying unit which rotates and which carries workpieces W on the circular trajectory is provided. That is, a hollow rotation shaft 3b passes through the bottom of the chamber 1 and stands in the chamber 1, and the rotation table 3 in a substantially circular shape is attached to the rotation shaft 3b. The rotation shaft 3b is coupled to an unillustrated driving mechanism. The rotation table 3 rotates around the rotation shaft 3b as a center by the driving mechanism. An immovable support pillar 3c is provided inside the hollow rotation shaft 3b. The support pillar 3C is fastened to an unillustrated base provided outside the chamber 1, and passes through the bottom of the chamber 1 and stands in the chamber 1. An opening is provided at the center of the rotation table 3. The support pillar 3c passes through the opening of the rotation table 3, and has an end located between the upper surface of the rotation table 3 and the upper surface of the chamber 1.

A ball bearing 3d is provided between the opening of the rotation table 3 and the support pillar 3c. That is, the rotation table 3 is rotatably supported by the support pillar 3c via the ball bearing 3d. Note that the end of the support pillar 3c constructs an inner-circumference support IP to be described later.

Since the chamber 1, the rotation table 3, and the rotation shaft 3b function as a cathode in the film formation apparatus D, it is preferable that those components are formed of a conductive metal material with a little electric resistance. The rotation table 3 may be formed by, for example, applying molten aluminum oxide on the surface of a stainless-steel plate member.

A plurality of holder units 3a that hold the workpieces W are installed on the upper surface of the rotation table 3. The plurality of the holder units 3a are installed at an equal pitch along the circumferential direction of the rotation table 3. When the rotation table 3 rotates, the workpieces W held by the holder units 3a move in the circumferential direction of the rotation table 3. In other words, a carrying path (hereinafter, the "carrying path L") that is a circular moving trajectory of the workpiece W is formed on the surface of the rotation table 3. The holder unit 3a may be, for example, a tray on which the workpiece W is placed.

In the following description, when a term "circumferential direction" is simply used, this indicates "the circumferential direction of the rotation table 3", and when a term "radial direction" is simply used, this indicates "the radial direction of the rotation table 3". Moreover, although the plate-shape substrate is applied as an example of the workpiece W in this embodiment, the kind, shape, and material of the workpiece W subjected to the plasma processing are not particularly limited. For example, a curved substrate that has a concavity or convexity at the center may be applied. Moreover, a substrate that includes a conductive material such as metal or carbon, a substrate that includes an insulation material such as glass or rubber, and a substrate that includes a semiconductor such as silicon may be applied.

Process units that executes processes in respective steps of the film formation apparatus D are provided above the rotation table 3. The each process unit are installed to be adjacent with each other at a predetermined interval therebetween along the carrying path L for the workpiece W formed on the surface of the rotation table 3. When the workpiece W held by the holder unit 3a passes through the space below each process unit, the process in each step is executed.

According to the example in FIG. 1, seven process units 4a to 4g are installed along the carrying path L on the rotation table 3. In this embodiment, the process units 4a, 4b, 4c, 4d, 4f, and 4g are film formation units that perform film formation on the workpiece W. The process unit 4e is a film process unit that processes the film formed on the workpiece W by the film formation units. In this embodiment, the film formation units 4a, 4b, 4c, 4d, 4f, and 4g are process units that deposit film formation materials on the workpiece W carried by the rotation table 3 by sputtering to form films. Moreover, the film process unit 4e performs post-oxidization. The post-oxidization is to introduce oxygen ions, etc., produced by plasma to the metal film formed by the film formation units to oxidize the metal film.

A load lock unit 5 is installed between the process unit 4a and the process unit 4g. With the interior of the chamber 1 being maintained at the vacuum condition, the load lock unit 5 carries the unprocessed workpiece W into the chamber 1 from the exterior, and carries out the processed workpiece W to the exterior of the chamber 1. In this embodiment, it is assumed that the carrying direction of the workpiece W is a clockwise direction in FIG. 1 from the position of the process unit 4a to the position of the process unit 4g. Needless to say, this is merely an example, and the carrying direction, the kind of the process units, the sequence of the process units, and the number thereof are not particularly limited, and may be designed as appropriate.

FIG. 2 illustrates an example structure of the process unit 4a that is a film formation unit. The other film formation units 4b, 4c, 4d, 4f, and 4g may employ the similar structure to that of the film formation unit 4a, the other film formation units may employ other structures. As illustrated in FIG. 2, the film formation unit 4a has includes a sputter source 6. The sputter source 6 is a supply source of the film formation material. The sputter source 6 includes a target 61, a backing plate 62, and electrodes 63. The target 61 is a plate member formed of the film formation materials which is to be deposited on the workpiece W to be a film. The target 61 is provided at a position that faces the workpiece W when the workpiece W passes through the space under the film formation unit 4a. Three circular targets 61 are provided in this embodiment. Two of the targets 61 have respective centers arranged in the radial direction of the rotation table 3. One of the target 61 has the center located at a position that forms one vertex of an isosceles triangle together with the respective centers of the other two targets 61.

The backing plate 62 is a member that holds the target 61. The electrode 63 is a conductive member to apply electric power to the target 61 from the exterior of the chamber 1. In addition, the sputter source 6 may include a magnet, a cooling mechanism, etc., as needed.

A DC power supply 7 that applies a DC voltage via the electrode 63 is connected to the target 61. Moreover, a sputter gas introducing unit 8 that introduces a sputter gas in the chamber 1 is provided at a location that faces the target 61 on the bottom of the chamber 1. An example sputter gas applicable is an inert gas such as argon.

A shielding member 9 is installed under the above-described sputter source 6. The shielding member 9 has an opening 91 at a side where the workpiece W passes through, and forms a film formation room S where the film formation unit 4a forms a film.

Figure 3:
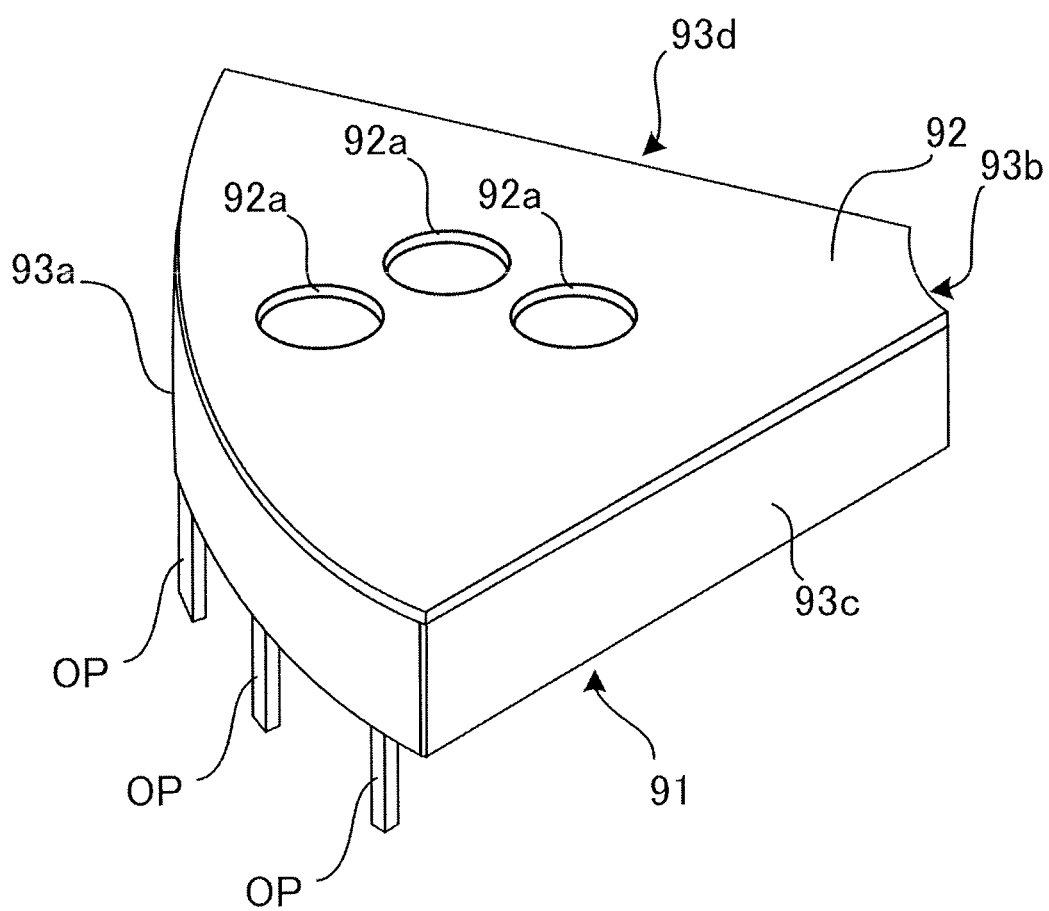
FIG. 3 is a perspective view illustrating the shielding member according to the embodiment in FIG. 1.

The shielding member 9 includes a ceiling 92 and a side surface 93. The ceiling 92 forms the ceiling of the film formation room S. As illustrated in FIGS. 2 and 3, the ceiling 92 is a plate member in a substantially sector shape provided in parallel with the plane of the rotation table 3. The ceiling 92 is provided with target holes 92a having the same size and shape as the target 61 at locations corresponding to the respective targets 61 so as to expose the respective targets 61 in the film formation room S. Moreover, the end of the sputter gas introducing unit 8 is extended to the proximity of the target 61 in the shielding member 9.

The side surface 93 forms the side surface around the edge of the film formation room S. The side surface 93 includes an outer-circumference wall 93a, an inner-circumference wall 93b, and dividing walls 93c and 93d. The outer-circumference wall 93a and the inner-circumference wall 93b are each in a curved plate member that extends down in the direction orthogonal to the plane of the rotation table 3. The upper edge of the outer-circumference wall 93a is attached to the outer edge of the ceiling 92. The upper edge of the inner-circumference wall 93b is attached to the inner edge of the ceiling 92.

The dividing walls 93c and 93d are each a flat plate member that extends down in the direction orthogonal to the plane of the rotation table 3. Upper edges of the dividing walls 93c and 93d are attached to the pair of edges of the ceiling 92 in the radial direction, respectively. The joined portion between the ceiling 92 and the side surface 93 is gas-tightly sealed. The ceiling 92 and the side surface 93 may be formed integrally, that is, continuously formed by a common material. By the shielding member 9, the film formation room S which has the upper part and the circumferential side surface covered by the ceiling 92 and the side surface 93 and which has an opened lower portion toward the workpiece W is formed.

Most of the film formation is carried out in this film formation room S. However, a leakage of the film formation material from the film formation room S occurs at the exterior of the film formation room S. Hence, there is a slight film deposition outside the film formation room. That is, the film formation region where the film formation unit 4a forms a film is slightly larger than the film formation room S that is defined by the shielding member 9.

When viewed from the top, the shielding member 9 is in a substantially sector shape that extends from the center side of the rotation table 3 toward the external side in the radial direction. The term substantially sector shape in this specification means the shape of a fan face of a folding fan. The opening 91 of the shielding member 9 is also in a substantially sector shape. The speed at which the workpiece W held on the rotation table 3 passes through under the opening 91 becomes slow toward the center side of the rotation table 3 in the radial direction and becomes fast toward the external side in the radial direction. Hence, when the opening 91 is simply in a rectangular shape or a square shape, a time at which the workpiece W passes through right under the opening 91 becomes different at the center side and at the external side in the radial direction. By causing the opening 91 to increase the diameter from the center side toward the external side in the radial direction, the time at which the workpiece W passes through the opening 91 becomes constant. This enables a uniform plasma processing to be described later. However, as long as the difference in passing time does not become a problem in products, the opening may be in a rectangular or square shape. Example materials of the shielding member 9 is aluminum or SUS.

The shielding member 9 is supported by a support P. The support P is a member which is immovable relative to the chamber 1, and which is independent from the lid 1a. In this embodiment, the support P includes an outer-circumference support OP and an inner-circumference support IP. The outer-circumference support OP is plurality of pillar members standing upright from the bottom of the chamber 1, and extend slightly higher than the workpiece W held on the rotation table 3 at the external side of the rotation table 3. The inner-circumference support IP is a flat surface provided at the end of the support pillar 3c. This inner-circumference support IP is designed to be substantially the same height as the outer-circumference support OP.

The shielding member 9 is mounted on the outer-circumference support OP and inner-circumference support IP. The upper end of the outer-circumference support OP supports the lower end of the outer-circumference wall 93a of the shielding member 9, and the inner-circumference support IP supports the lower end of the inner-circumference wall 93b of the shielding member 9. A clearance that allows the workpiece W on the rotating rotation table 3 to pass through is formed between lower ends of the dividing walls 93c and 93d and the rotation table 3. That is, the height of the support P is designed to create a slight clearance between the lower end of the shielding member 9 and the workpiece W.

In contrast, the upper part of the shielding member 9, that is, the ceiling 92 has a height that does not contact with the lid 1a when the lid 1a is closed. The heights of the outer-circumference support OP and the inner-circumference support IP, the height of the side surface 93, and the thickness of the ceiling 92 are set to a height that does not contact with the lid 1a. The clearance between the lid 1a and the ceiling 92 is a distance that does not cause the bent lid 1a does not contact the ceiling 92 when vacuumed. For example, a bending amount that is a displacement amount of the bent lid 1a in the height direction when vacuumed is checked beforehand via tests, etc. Accordingly, a clearance greater than this bending amount is set to be the distance between the lower surface of the lid 1a and the upper surface of the ceiling 92.

The film process unit 4e is installed on the upper surface of the interior of the chamber 1, and includes the electrode formed in a cylindrical shape (hereinafter, "cylindrical electrode"). The cylindrical electrode 10 has a rectangular cylindrical shape, has an opening 11 at one end, and is closed at the other end. The cylindrical electrode 10 is installed so as to pass through a through-hole provided in the upper surface of the chamber 1, and have an end at the opening-11 side located in the chamber 1 and have the closed end located outside the chamber 1. The cylindrical electrode 10 is supported by the circumference edge of the through-hole of the chamber 1 via an insulation material. The opening 11 of the cylindrical electrode 10 is located at a position facing the carrying path L formed on the rotation table 3. That is, the rotation table 3 is the carrying unit that carries the workpiece W to pass through right below the opening 11. Accordingly, the position right below the opening 11 is a passing position of the workpiece W.

As illustrated in FIGS. 1 and 2, when viewed from the top, the cylindrical electrode 10 and the opening 11 thereof have a substantially sector shape that increases the diameter from the center side of the rotation table 3 toward the external side in the radial direction, like the shielding member 9. The reason why the electrode and the opening are in a substantially sector shape is the same as the shielding member 9, and as long as the difference in passing time does not becomes a problem on product, those may be in a rectangular or square shape.

As described above, the cylindrical electrode 10 passes through the through-hole of the chamber 1, and a part of the electrode is exposed to the exterior of the chamber 1. The exposed part of the cylindrical electrode 10 is covered with an external shield 12 as illustrated in FIG. 2. The external shield 12 maintains the gas-tightness of the internal space of the chamber 1. The surroundings of the part of the cylindrical electrode 10 located in the interior of the chamber 1 are covered with an internal shield 13.

The internal shield 13 is in a rectangular cylindrical shape coaxial with the cylindrical electrode 10, and is supported on the upper surface in the interior of the chamber 1. Each side surface of a cylinder of the internal shield 13 is substantially in parallel with each side surface of the cylindrical electrode 10. The lower end of the internal shield 13 is located at the same position in the height direction as that of the opening 11 of the cylindrical electrode 10. A flange 14 extending in parallel with the upper surface of the rotation table 3 is provided at the lower end of the internal shield 13. This flange 14 prevents the plasma produced in the interior of the cylindrical electrode 10 from flowing to the exterior of the internal shield 13. The workpiece W carried by the rotation table 3 passes through the clearance between the rotation table 3 and the flange 14 and is carried to right below the opening 11 of the cylindrical electrode 10, and again passes through the clearance between the rotation table 3 and the flange 14 and is carried out from the position right below the opening 11 of the cylindrical electrode 10.

An RF power supply 15 for applying a high frequency voltage is connected to the cylindrical electrode 10. A matching box 21 that is a matching circuit is connected in series to the output side of the RF power supply 15. The RF power supply 15 is also connected to the chamber 1. The cylindrical electrode 10 serves as an anode, while the rotation table 3 standing from the chamber 1 serves as a cathode. The matching box 21 matches the impedance at the input side and the impedance at the output side to stabilize plasma discharge. Note that the chamber 1 and the rotation table 3 are grounded. The internal shield 13 that has the flange 14 is also grounded.

Moreover, a process gas introducing unit 16 is connected to the cylindrical electrode 10, and a process gas is introduced into the interior of the cylindrical electrode 10 from an external process gas supply source via the process gas introducing unit 16. The process gas can be changed as appropriate in accordance with the purpose of film processing. When, for example, etching is to be performed, an inert gas such as argon is applied as an etching gas. When oxidization or post-oxidization process is to be performed, oxygen may be applied. When nitriding process is to be performed, nitrogen may be applied. The RF power supply 15 and the process gas introducing unit 16 are both connected to the cylindrical electrode 10 via a through-hole provided in the external shield 12.

The film formation apparatus D further includes a control unit 20. The control unit 20 includes an arithmetic processing unit called a processor, such as a PLC or a CPU. The control unit 20 executes a control on introduction and discharging of the sputter gas and the process gas relative to the chamber 1, a control on the DC power supply 7 and the RF power supply 15, and a control on the rotation speed of the rotation table 3, etc.

[Action]

An action of the film formation apparatus D according to this embodiment will be described. With the lid 1a being opened, the shielding member 9 is mounted on the outer-circumference support OP and the inner-circumference support IP. Since the outer-circumference support OP and the inner-circumference support IP are designed to have the above-described height, the lower end of the shielding member 9 is supported so as to have the clearance which the workpiece W can pass through.

After the chamber 1 is sealed by the lid 1*a*, the interior of the chamber 1 is discharged by the discharging unit 2 and becomes a vacuumed condition. With the vacuumed condition of the chamber 1 being maintained, the unprocessed workpiece W is carried into the chamber 1 from the load lock unit 5. The carried workpiece W is held by the holder unit 3*a* of the rotation table 3 each positioned in sequence by the load lock unit 5. Moreover, by continuously rotating the rotation table 3, the workpiece W is carried along the carrying path L, and passes through under each of the process units 4*a* to 4*g*.

When vacuuming is performed, the lid 1*a* is bent by an atmospheric pressure. However, the shielding member 9 is not attached to the lid 1*a*, and is supported by the outer-circumference support OP and the inner-circumference support IP both independent from the lid 1*a*. Moreover, the ceiling 92 of the shielding member 9 is located at the position not contacting the bent lid 1*a*. Accordingly, even if the lid 1*a* is bent by vacuuming, the clearance between the shielding member 9 and the rotation table 3 as originally designed remains unchanged, and the clearance between the workpiece W and the lower end of the shielding member 9 is maintained.

In the film formation unit 4*a*, the sputter gas is introduced from the sputter gas introducing unit 8, and a DC voltage is applied to the sputter source 6 from the DC power supply 7. Application of the DC voltage produces plasma sputter gas, and ions are produced. When the produced ions are bombarded to the target 61, the materials of the target 61 are beaten out. The beaten-out materials are deposited on the workpiece W passing through under the film formation unit 4*a*, and a thin film is formed on the workpiece W. The other film formation units 4*b*, 4*c*, 4*d*, 4*f*, and 4*g* form films by similar schemes. However, it is not necessary to form films by all film formation units. As an example, in this case, an Si film is formed on the workpiece W by DC sputtering.

The workpiece W having undergone the film formation by the film formation units 4*a* to 4*d*, 4*f*, and 4*g* is subsequently carried on the carrying path L by the rotation table 3, and passes through the film process unit 4*e*. In the film process unit 4*e*, the workpiece W passes through the position right below the opening 11 of the cylindrical electrode 10, that is, the film processing position. As described above, in this embodiment, an example case in which the post-oxidization is performed in the film process unit 4*e* is explained. In the film process unit 4*e*, an oxygen gas that is the process gas is introduced in the cylindrical electrode 10 from the process gas introducing unit 16, and a high frequency voltage is applied to the cylindrical electrode 10 from the RF power supply 15. Application of the high frequency voltage produces plasma oxygen gas, and electrons, ions, and radicals, etc., are produced. The plasma flows into the rotation table 3 that is the cathode from the opening 11 of the cylindrical electrode 10 that is the anode. Ions in the plasma are bombarded to the thin film on the workpiece W passing through under the opening 11, and the thin film is post-oxidized.

[Action and Effect]

(1) The film formation apparatus D according to this embodiment includes the chamber 1 which has an interior capable of being vacuumed and includes the lid 1*a* that is openable and closable on the upper part of the chamber, the rotation table 3 which is provided in the chamber 1 and which rotates and which carries the workpiece W on the circular trajectory, the film formation units 4*a* to 4*d*, 4*f*, and 4*g* which deposit respective film formation materials by sputtering on the workpiece W carried by the rotation table 3 to form films, the shielding member 9 which has the opening 91 at the side through which the workpiece W passes and forms the film formation room S where the film formations by the film formation units 4*a* to 4*d*, 4*f*, and 4*g* are performed, and the support P which supports the shielding member 9 and is immovable relative to the chamber 1 and is independent from the lid 1*a*.

As described above, the shielding member 9 is supported by the support P that is independent from the lid 1*a* of the chamber 1. Hence, adjustment of the distance between the workpiece W carried by the rotation table 3 and the shielding member 9 can be carried out easily and precisely. For example, since even if the shielding member 9 is relatively heavy, the shielding member 9 can be lifted up by a lifter and installed on the support P, the number of workers and the effort can be remarkably reduced. Moreover, even if the lid 1*a* is bent at the time of vacuuming, the shielding member 9 is not likely to be deformed. By designing the clearance between the lid 1*a* and the ceiling 92 of the shielding member 9 to be the distance that does not contact even if the lid 1*a* is bent, the deformation of the shielding member 9 can be prevented.

In this embodiment, the size and weight of the shielding member 9 are not limited to specific values. However, this embodiment is more suitable when the shielding member 9 is relatively large and is heavy. For example, as a comparative example, it is assumed that the shielding member 9 is attached and fastened by screw, etc., to the lifted lid 1*a* to open upwardly with a worker extending the arm. In such a case, a length which a worker with an average height can reach by extending the arms at the time of attachment work is considered. In this case, when the maximum length of the shielding member 9 in the direction parallel to the lid 1*a* is equal to or greater than 400 mm, it is difficult for the worker to extend the arms to reach the other side from the one side. Hence, when the maximum length of the shielding member 9 is equal to or greater than 400 mm, application of this embodiment is desirable. Moreover, when a worker attaches the shielding member 9 to the lid 1*a*, the work becomes quite difficult if the shielding member 9 is equal to or heavier than 25 kg. Hence, when the shielding member 9 is equal to or heavier than 25 kg, application of this embodiment is desirable.

(2) The support P includes the outer-circumference support OP that support the shielding member 9 at the outer circumference side (outer-circumference wall 93*a*) of the rotation of the rotation table 3, and the inner-circumference support IP that supports the shielding member 9 at the inner circumference side (inner-circumference wall 93*b*) of the rotation of the rotation table 3. This enables a stable support of the shielding member 9 across the rotation table 3 at both the outer circumference side and the inner circumference side while allowing the rotation table 3 to rotate. Application of the support pillar 3*c* that supports the rotation shaft 3*b* of the rotation table 3 as the inner-circumference support IP eliminates the necessity of particular space and members to support the inner circumference side of the shielding member 9.

Modified Examples

The embodiment of the present disclosure is not limited to the above-described embodiment, and also covers the following aspects. As for the similar structure to that of the above-described embodiment, the description will be omitted.

Figure 4:
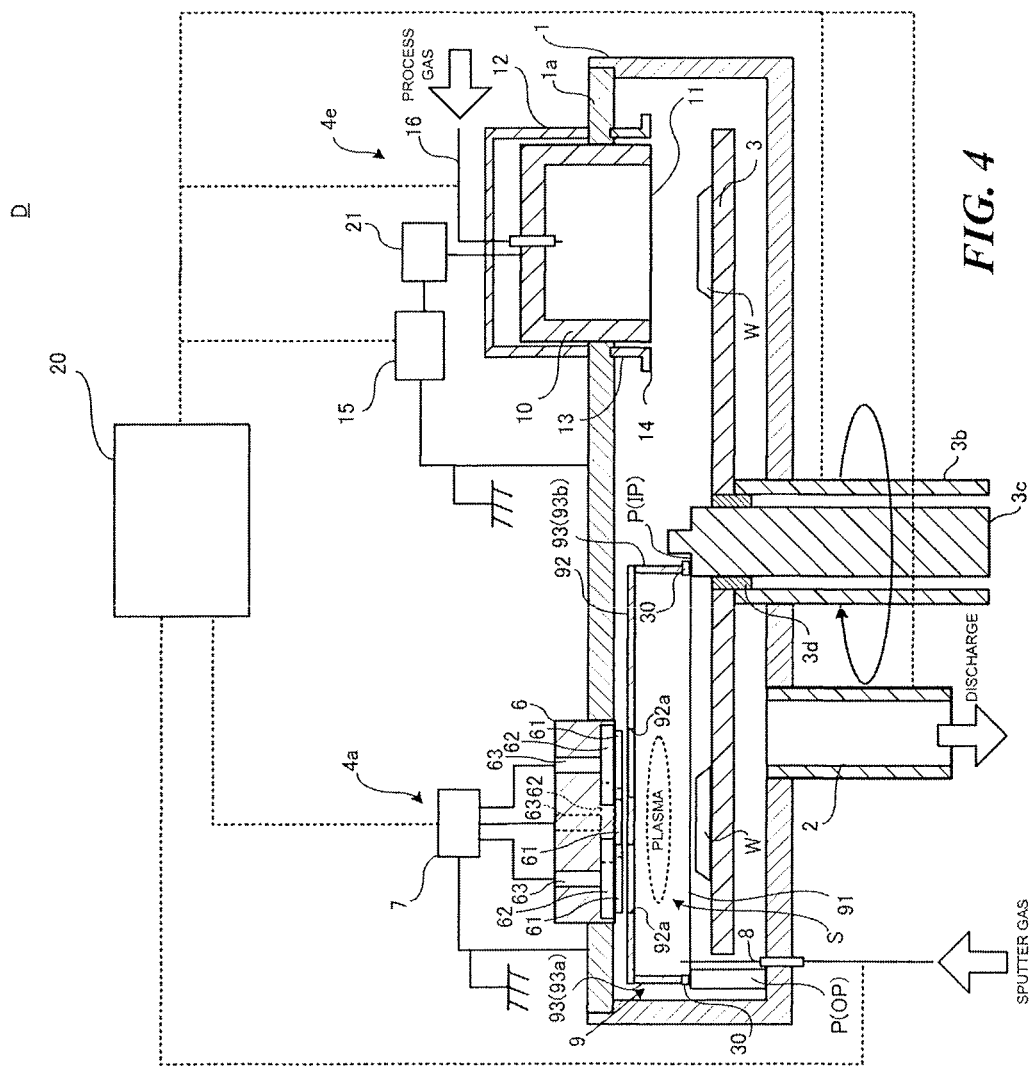
FIG. 4 is a cross-sectional view illustrating a modified example in which a vibration absorber is applied between a support and the shielding member.
Figure 5:
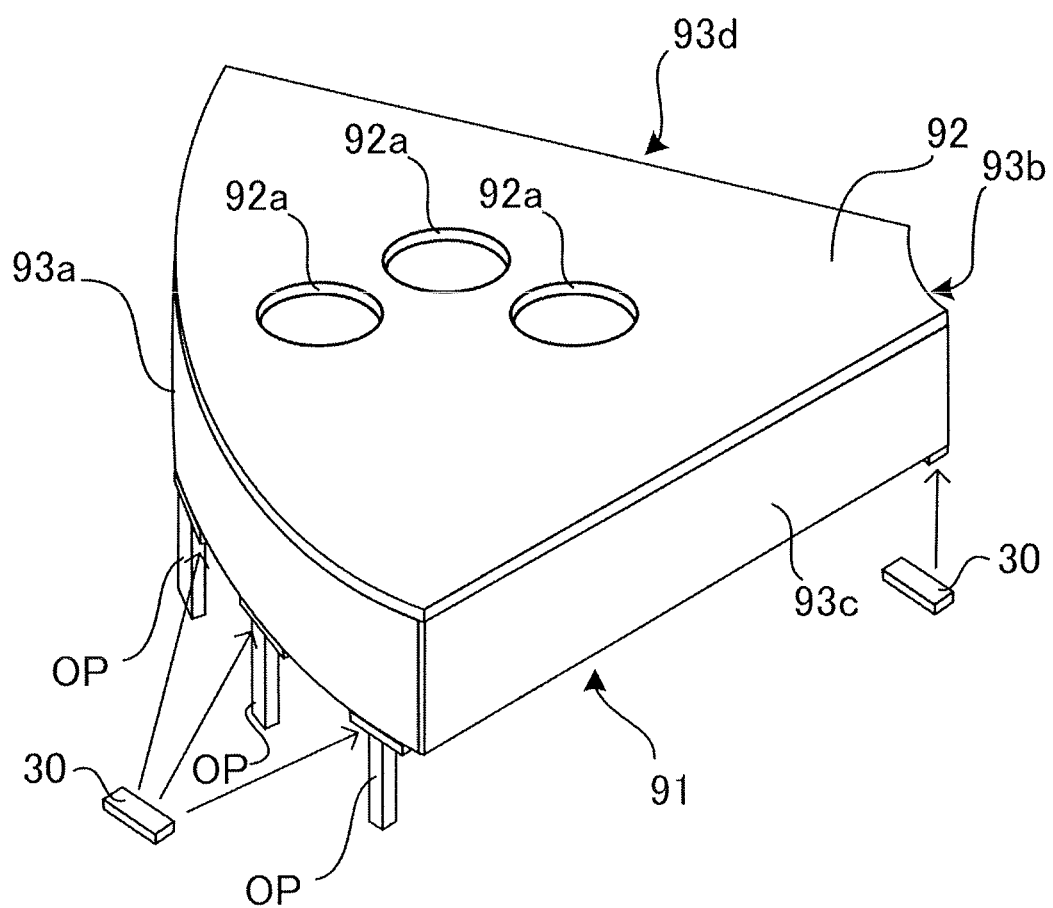
FIG. 5 is a perspective view illustrating the shielding member according to the embodiment in FIG. 4.

(1) As illustrated in FIG. 4 and FIG. 5, a vibration absorber (first vibration absorber) 30 may be provided between the shielding member 9 and the support P. That is, the vibration absorbers 30 is held between the lower end of the outer-circumference wall 93a and the outer-circumference support OP, and between the lower end of the inner-circumference wall 93b and the inner-circumference support IP, respectively. An example vibration absorber 30 is an elastic material in a cuboid, circular cylindrical, or rectangular cylindrical shape, etc. An example elastic material is a material that has a spring constant of, for example, $1 \times 10^{-3}$ N/mm to 400 N/mm. An example elastic material is rubber. When the outer-circumference support OP and the inner-circumference support IP support the shielding member 9 by relatively large planes, the vibration absorber 30 in a sheet shape may be applied.

Installation of such a vibration absorber 30 prevents vibration due to the rotation of the rotation table 3 from being transmitted to the shielding member 9 in the film formation room S at the time of film formation. Since the film formation materials fly out and disperse in the film formation room S during film formation by sputtering, the film formation materials stick to the internal wall of the shielding member 9 as a film. When vibration is applied to the shielding member 9, the film sticking to the internal wall may be peeled and may fall as particles. In particular, when particles fall on the upper part of the workpiece W, the film formation quality decreases. In this embodiment, since the vibration of the shielding member 9 is suppressed by the vibration absorber 30, the particles can be reduced, and the decrease of the film formation quality is avoided.

Figure 6:
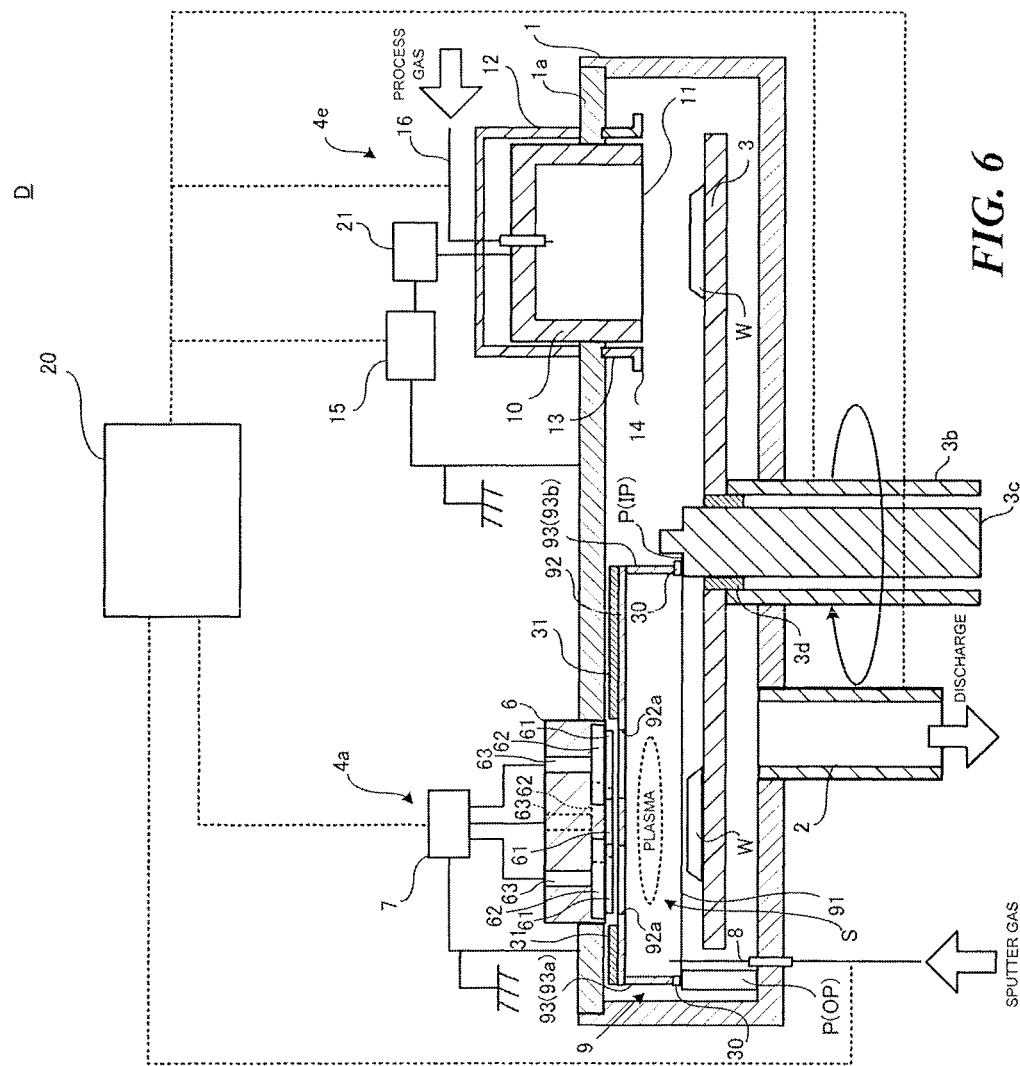
FIG. 6 is a cross-sectional view illustrating a modified example in which a vibration absorber is applied between the shielding member and a lid.

(2) As illustrated in FIG. 6, in addition to the vibration absorber 30 illustrated in FIG. 5, a vibration absorber (second vibration absorber) 31 may be provided between the shielding member 9 and the lid 1a. That is, the vibration absorber 31 is held between the upper surface of the ceiling 92 and the lower surface of the lid 1a. An example vibration absorber 31 is an elastic material in a sheet, circular cylindrical, rectangular cylindrical shape, etc. The material of the vibration absorber 31 is the same as that of the vibration absorber 30.

The reason why the vibration absorber 31 is installed between the shielding member 9 and the lid 1a is based on the following knowledges. Firstly, since all the wall surfaces of the chamber 1 that is a sealed container are continuous or in contact with each other, when vibration is applied to one site, this spreads to allover the wall surfaces. Hence, it is a common technical knowledge that the entire chamber 1 will vibrate substantially uniformly.

However, when the inventor measured the vibration of each part of the film formation apparatus D, the following results were obtained. The measurements were made by measuring the accelerations (m/s$^2$) of the respective vibrations of [1] the outer bottom surface of the chamber 1, [2] the lid 1a, [3] the internal wall surface of the film formation room S, and [4] the installation plane of the film formation apparatus D, when the rotation table 3 was rotated at (a) 80 rpm, and (b) 120 rpm using an acceleration sensor.

[1] Outer bottom surface of Chamber 1, (a) 4.6, (b) 6.3
[2] Lid 1a, (a) 0.48, (b) 0.67
[3] Shielding member 9, (a) 7.6, (b) 8.8
[4] Installation plane, (a) 1.2, (b) 2.3

That is, it is found that only the lid 1a has significantly little vibration. Therefore, the inventor thought to intentionally contacting the shielding member 9 to the lid 1a that is a part of the chamber 1 considered as having large vibration in view of common technical knowledge s, to achieve a vibration controlling function. However, when the shielding member 9 directly contacts the lid 1a, the shielding member 9 is deformed due to the bending, etc., of the lid 1a, and it becomes difficult to precisely design the clearance between the shielding member 9 and the rotation table 3.

Hence, the inventor further inserted the vibration absorber 31 between the lid 1a and the shielding member 9. It is appropriate that the thickness of the vibration absorber 31 is checked beforehand by tests, etc. For example, the bent amount caused by the bending of the lid 1a at the time of vacuuming may be checked beforehand. Next, the clearance between the lid 1a and the vibration absorber 31 may be set to be the same as the bent amount of the lid 1a so as to contact the vibration absorber 31 and the bent lid 1a at the time of depressurization.

Accordingly, the lid 1a that actually has little vibration suppresses a vibration of the shielding member 9 by a vibration controlling function, and also suppresses the deformation of the shielding member 9. Moreover, a damage due to metal friction between the bent lid 1a and the shielding member 9 can be prevented. Since the vibration absorber 31 closes the clearance with the lid 1a at the time of film formation, the process gas from the film process unit 4e and the sputter particles from the other film formation units 4 can be prevented from flowing around. This prevents the surface of the target 61 to be contaminated by the process gas and the film formation materials from the other film formation units 4.

Figure 7:
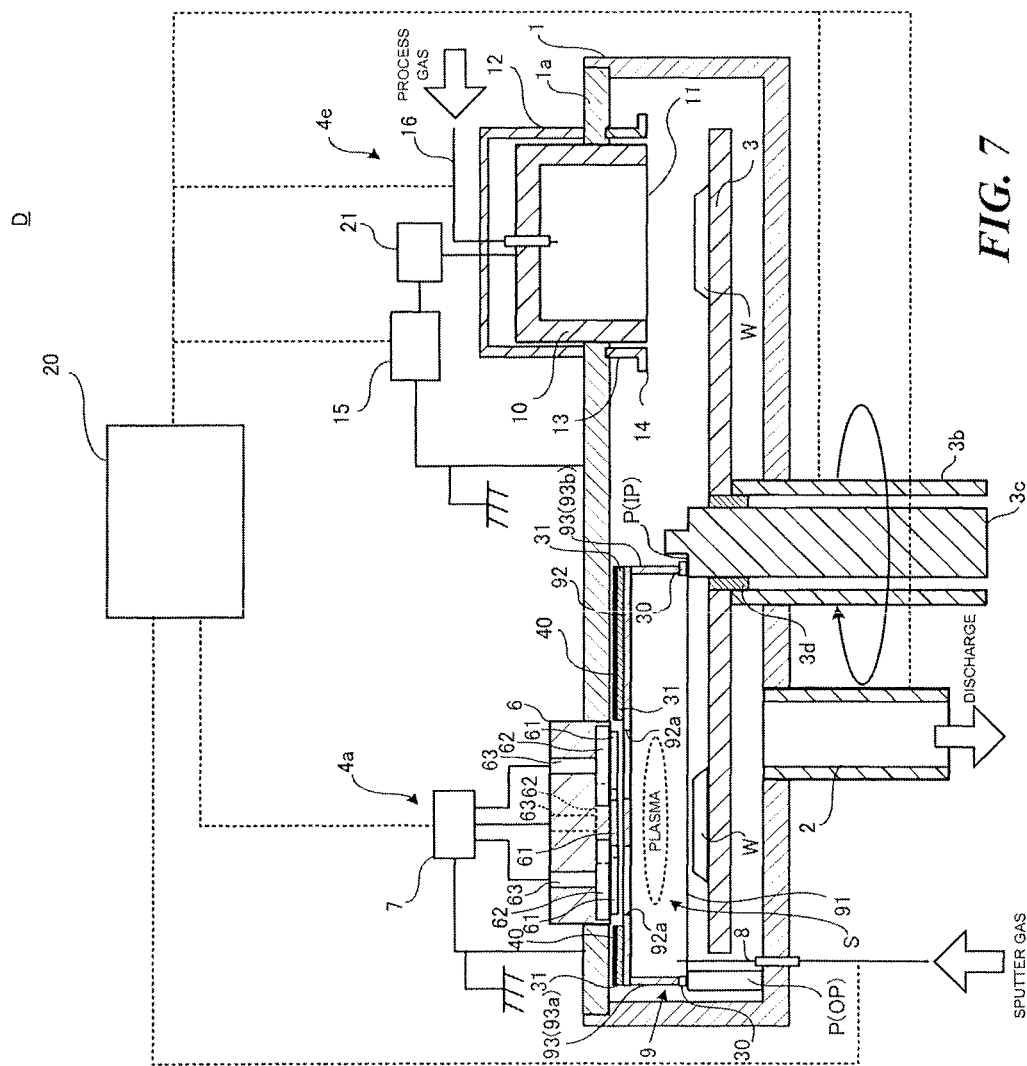
FIG. 7 is a cross-sectional view illustrating a modified example using a heat dissipating member.

(3) As illustrated in FIG. 7, a heat dissipating member 40 may be installed between the vibration absorber 31 illustrated and the lid 1a in FIG. 6. That is, the heat dissipating member 40 is laid on the vibration absorber 31. Example heat dissipating members 40 are sheet members with excellent thermal conductivity, such as a carbon sheet and a copper sheet. For example, a material that has the thermal conductivity of 0.2 W/mK to 2000 W/mK is applicable as the heat dissipating member 40.

The reason why the heat dissipating member 40 is installed is based on the following reasons. That is, the shielding member 9 is heated and expands due to the heat of sputtering. After the sputtering ends, when the temperature of the shielding member 9 decreases and the shielding member shrinks, the film formation materials sticking to the shielding member 9 are peeled off and fall down.

In this embodiment, since the heat of the shielding member 9 in sputtering is transmitted to the lid 1a via the vibration absorber 31 and the heat dissipating member 40, a thermal expansion of the shielding member 9 is suppressed. Hence, the shrinkage of the shielding member 9 after sputtering is also reduced, preventing the film formation materials from being peeled off. Note that only the heat dissipating member 40 may be installed between the lid 1a and the shielding member 9. Moreover, when only the heat dissipating member 40 is installed between the lid 1a and the shielding member 9, by forming the heat dissipating member 40 with a material that has the similar elasticity to that of the vibration absorber 31, both heat dissipation and vibration controlling effects can be achieved. For example, a material which has a spring constant of $1 \times 10^{-3}$ N/mm to 400 N/mm, and which has a thermal conductivity of 0.2 W/mK to 2000 W/mK is applicable.

Figure 8:
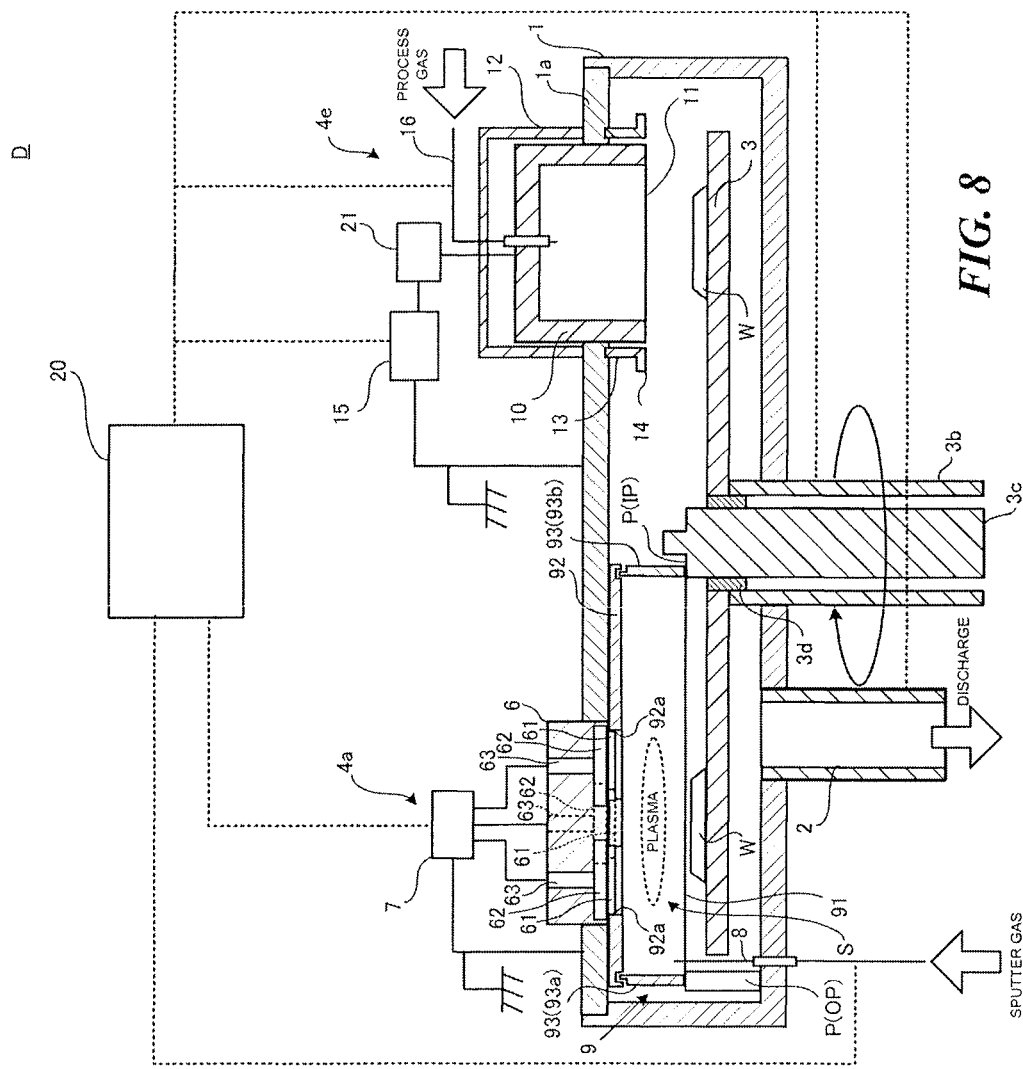
FIG. 8 is a cross-sectional view illustrating a modified example in which the shielding member that has the ceiling and a side surface separated.

(4) As illustrated in FIG. 8, a part of shielding member 9 may be separated from other parts, and may be attached to the lid 1a. For example, the ceiling 92 may be fastened to the lid 1a. The ceiling 92 is separated from the side surface 93. However, it is preferable that a labyrinth structure which is a combination of concavities and convexities that do not contact with each other is employed between the ceiling 92 and the side surface 93. In order to maintain a non-contact condition even if the lid 1a is bent, it is appropriate to set the depths of the concavities and convexities to a depth that permits the bent amount of the lid 1a.

Accordingly, since the side surface 93 and the ceiling 92 does not contact with each other, vibration of the side surface 93 can be prevented from being transmitted to the ceiling 92. Since the lid 1a has little vibration, the vibration of the ceiling 92 is also little. This avoids a peeling of the film formation material due to the vibration of the ceiling 92, and avoids affects to the workpiece W under the ceiling 92. Moreover, by employing the labyrinth structure between the side surface 93 and the ceiling 92, a leakage of the sputter gas and the film formation material can be reduced.

Figure 9:
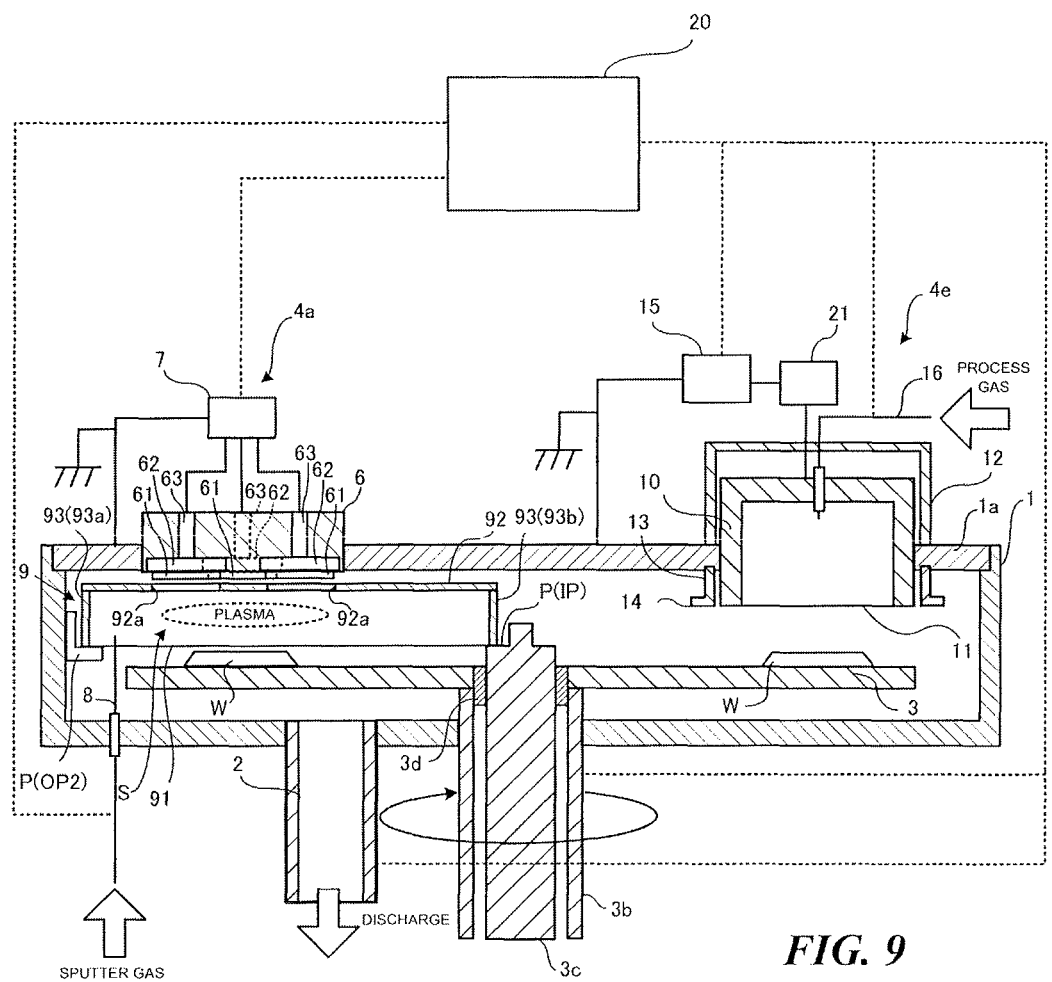
FIG. 9 is a cross-sectional view illustrating a modified example in which an outer-circumference support is provided on the internal side surface of the chamber.

(5) The outer-circumference support OP are not limited to the structure of standing from the bottom surface of the chamber 1. For example, as illustrated in FIG. 9, an outer-circumference support OP2 may be a protrusion attached to the internal side surface of the chamber 1, and a flat part of this protrusion may support the shielding member 9. This enables a reduction of a clearance between the outer circumference edge of the rotation table 3 and the internal side surface of the chamber 1, achieving a downsizing of the entire film formation apparatus D.

Figure 10:
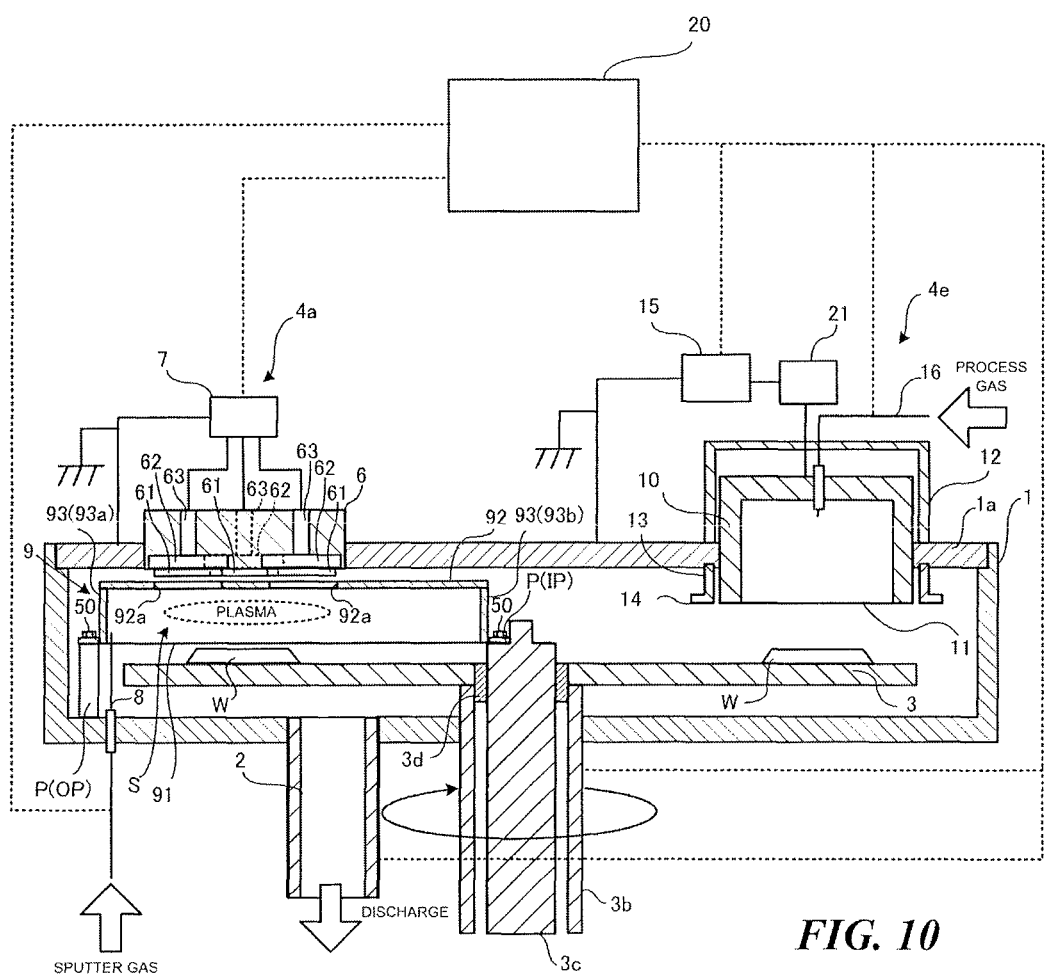
FIG. 10 is a cross-sectional view illustrating a modified example in which the shielding member is fixed by fastening member.

(6) As illustrated in FIG. 10, the shielding member 9 may be fastened to the outer-circumference support OP and the inner-circumference support IP by fastening members 50, such as bolts and screws. As the fastening locations by the fastening members 50, the location where the film formation material sticks may cause the production of the particles, and it is preferable that the fastening locations is outside the shielding member 9. This enables the shielding member 9 to be firmly fastened, and a stable clearance between the workpiece W and the shielding member 9 is maintained.

Figure 11:
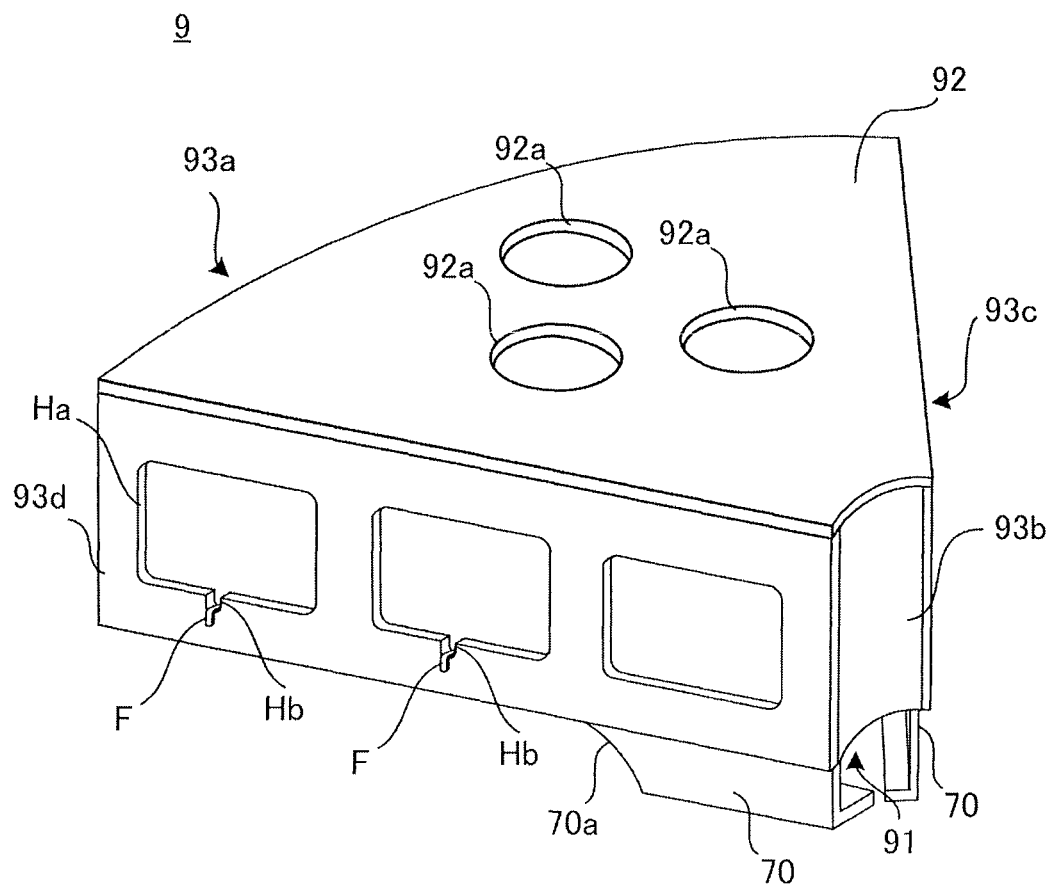
FIG. 11 is a perspective view of the shielding member that is a modified example using an adjusting member.
Figure 12:
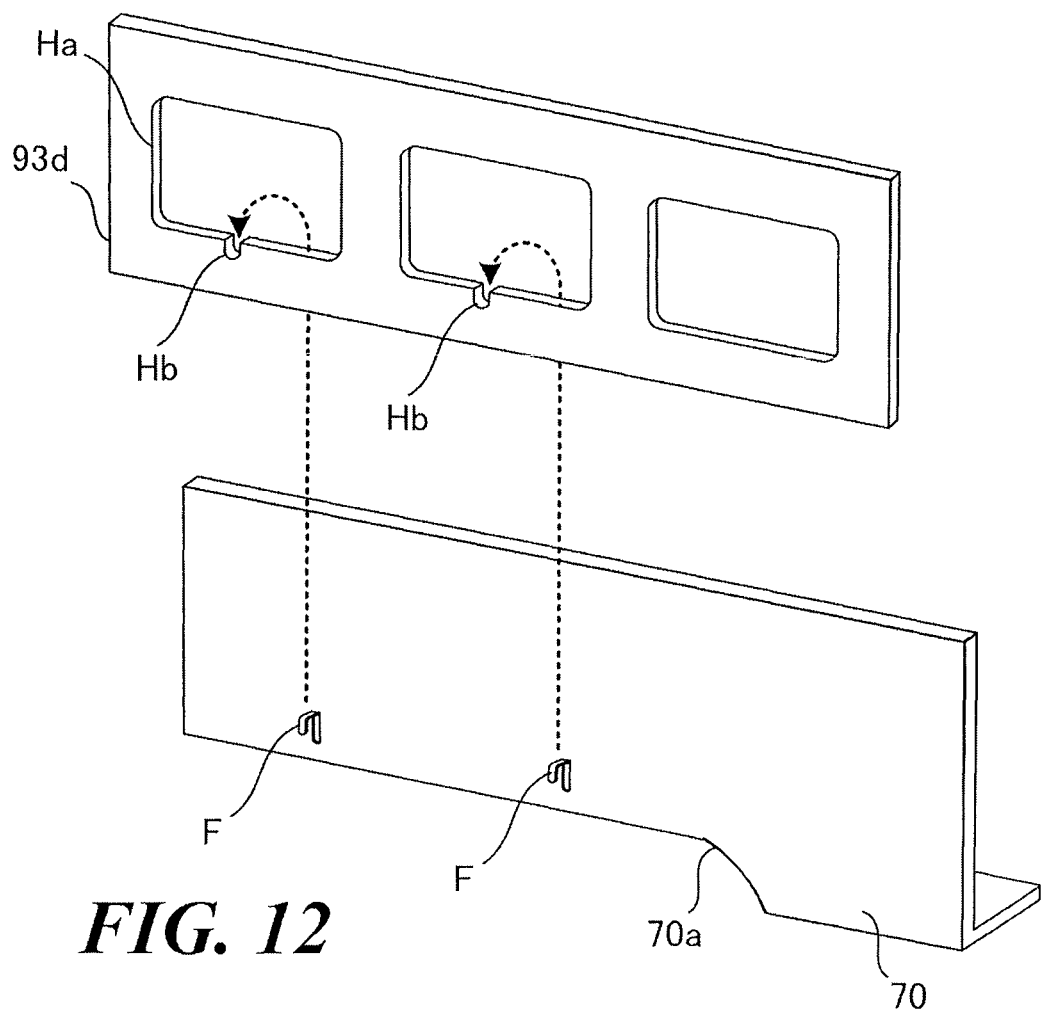
FIG. 12 is a perspective view illustrating an attaching structure of the adjusting member.
Figure 13:
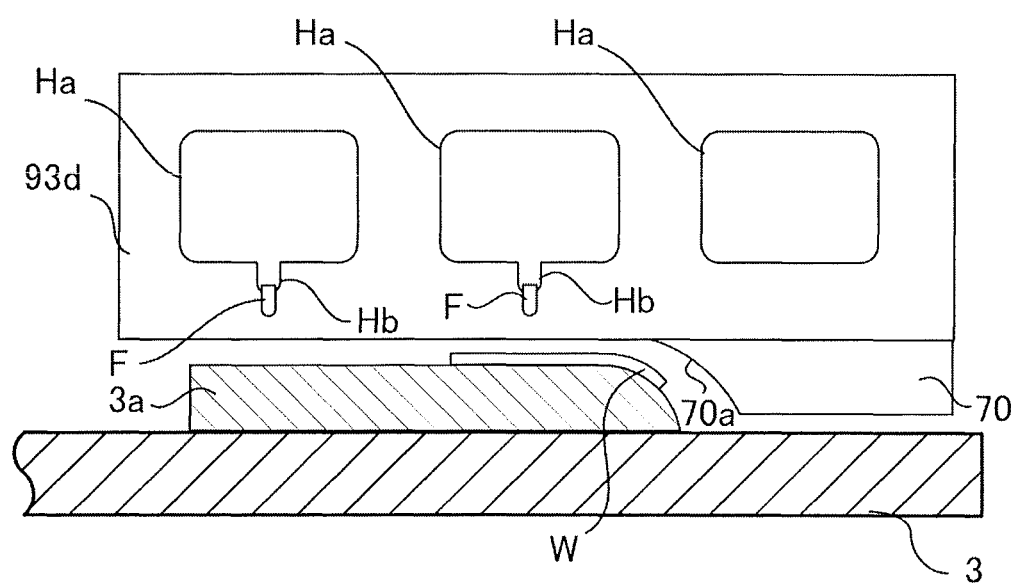
FIG. 13 is a side view of a modified example using the adjusting member.

(7) As illustrated in FIGS. 11, 12, and 13, an adjusting member 70 may be freely detachably attached to the shielding member 9 to adjust the clearance between the shielding member 9 and the workpiece W. For example, the adjusting member 70 may be provided on the dividing walls 93c and 93d of the shielding member 9 in a freely detachable manner. Although the adjusting member 70 is in the same shape as that of the dividing wall 93d, there is a difference that an edge 70a in a shape that matches the curved surface of the workpiece W is formed at the lower end of the adjusting member 70. The adjusting member 70 is provided with positioning portions F for positioning. The positioning portions F according to this embodiment are in a hook shape that has a bent hook. a plurality of lightening holes Ha in a substantially rectangular shape are formed in the dividing walls 93c and 93d to achieve a weight saving. A locking portion Hb which the positioning portion F is to be locked is formed at the lower edge of the lightening hole Ha. The locking portion Hb according to this embodiment is a notch to be engaged with the positioning portion F in a hook shape. Note that an un illustrated anti-sticking plate is provided inwardly relative to the ceiling 92, the outer-circumference wall 93a, and the inner-circumference wall 93b. This prevents the film formation material at the time of sputtering in the film formation room S from sticking to the ceiling 92, the outer-circumference wall 93a, and the inner-circumference wall 93b.

The adjusting member 70 is inserted from the opening 91 at the lower side of the shielding member 9, and as illustrated in FIG. 12, the positioning portions F are hooked and locked with the locking portions Hb. Hence, as illustrated in FIG. 13, the edge 70a of the adjusting member 70 matches and faces with interval to the shape of the workpiece W on the holder unit 3a carried by the rotation table 3.

Accordingly, an increase in the clearance between a part of the workpiece W and the shielding member 9 is prevented, and a leakage of the film formation material and the sputter gas can be prevented. By preparing the adjusting members 70 that have shapes matching various shapes of the workpieces W, a change in shape of the workpiece W can be coped with by simply replacing the adjusting member 70.

Moreover, since the film formation materials at the time of sputtering in the film formation room S stick to the adjusting member 70, the adjusting member 70 also functions as an anti-sticking plate that avoids a film formation on the shielding member 9. By detaching the adjusting member 70 and the anti-sticking plate for cleaning or replacement, the film can be removed. Hence, a work of cleaning or replacing the shielding member 9 that is a heavy component can be omitted.

Furthermore, in comparison with the case in which there is the shielding member 9 at the lid-1a side, attachment and detachment of the adjusting member 70 are easy, and the position thereof is stable. Adjustment of the distance between the edge 70a and the workpiece W is also easy. By simply hooking the positioning portion F to the locking portion Hb, the adjusting member 70 can be easily attached. Moreover, since it is unnecessary to remove the film from the shielding member 9, the shielding member 9 is prevented from being deformed. This enables a continuous utilization of the shielding member 9 for a number of times, and re-achievement of the precise attaching position is unnecessary. For example, when the shielding member 9 is produced, there may be errors in a processing on a component. Moreover, when the entire apparatus is in a large-size and the shielding member 9 is large, the errors are also large. In this case, even if the shielding members 9 in the same shape are produced, the position of the locking portion Hb may vary by such errors. However, when the same shielding member 9 can be repeatedly used, the position of the locking portion Hb can be maintained constant.

Figure 14A:
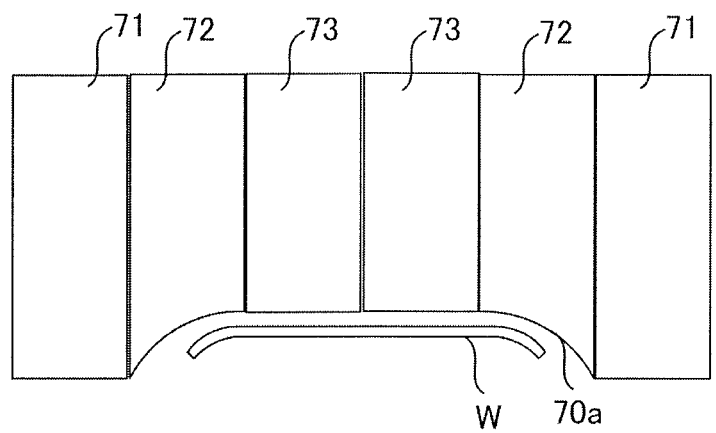
FIGS. 14A and 14B are each an explanatory diagram illustrating an example case in which the adjusting member is constructed by a combination of divided components.
Figure 14B:
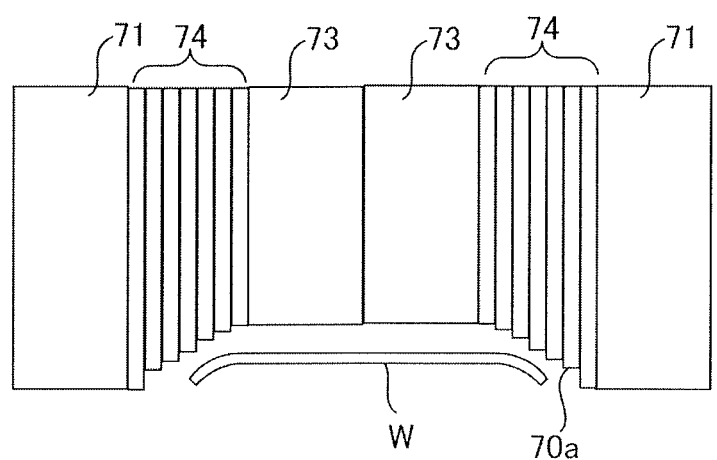

(8) As illustrated in FIGS. 14A and 14B, the adjusting member 70 may be formed by a combination of a plurality of divided components 71 to 74. For example, as illustrated in FIG. 14 A, by combining the divided components 71 and 73 that have a flat lower end with the divided component 72 that has a curved lower end, the edge 70a along the shape of the workpiece W can be formed. Moreover, as illustrated in FIG. 14 B, by combining the dividing members 74 that have flat lower ends, the edge 70a that is similar to the curved portion of the workpiece W can be formed.

Accordingly by forming the adjusting member 70 by a combination of the plurality of divided components 71 to 74, the shape of the edge 70a can be easily changed. Hence, a change of the workpiece W in different shapes can be coped with without preparing the multiple types of adjusting members 70, enabling a configuration the apparatus suitable for product with small-lot and various-kind. Moreover, in comparison with the case in which the shielding member 9 is present at the lid-1a side, assembling and attachment and detachment of the adjusting member 70 are easy, and the position of the adjusting member 70 is stable. The adjustment of the distance between the edge 70a and the workpiece W is easy.

(9) A correction plate may be installed at the lower end of the shielding member 9 or at the lower end of the adjusting member 70. The correction plate is freely detachably attached to the shielding member 9, and adjusts the thickness distribution of the film to be formed. The correction plate corrects the film thickness distribution by forming a region that blocks sputter particles in a part of the film formation region. That is, this is a plate that prevents the sputter particles from sticking in an amount beyond the necessity to a location where a large number of sputter particles is likely to stick and the film is likely to be thick.

Figure 15:
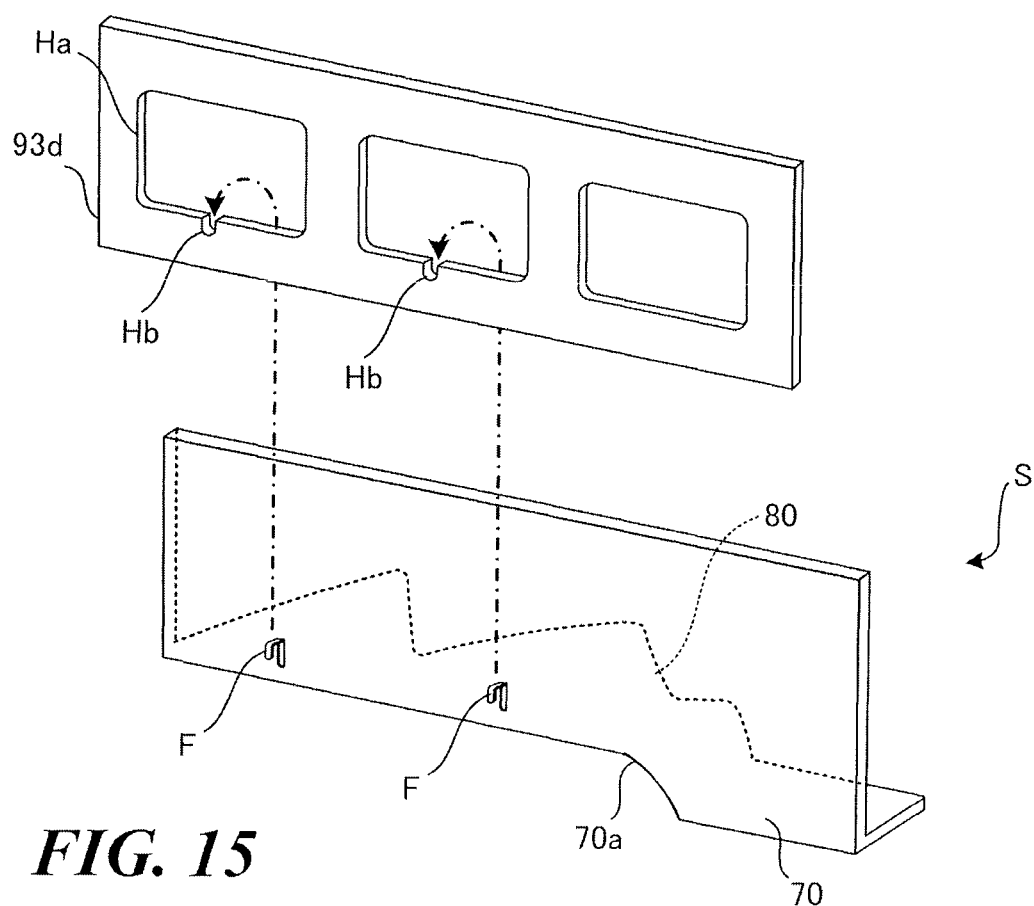
FIG. 15 is a side view of a modified example using a correction plate.

For example, as illustrated in FIG. 15, a correction plate 80 is formed as a surface bent toward the internal side of the film formation room S at the lower end of the adjusting member 70 that is attached to and detached from the dividing wall 93d of the shielding member 9. In FIG. 15, three protrusions protruded toward the film formation room S are formed at locations where the film thickness distribution becomes thick in the circumferential distribution of the correction plate 80. Accordingly, the protrusions block the sputter particles, preventing the sputter particles from sticking to the workpiece W in an amount beyond the necessity to achieve a uniform film thickness distribution.

By the attachment of the correction plate 80 to the shielding member 9, the inner-circumference and outer-circumference support that supports the correction plate 80, and the vibration absorber are not necessary, like the shielding member 9. Moreover, it becomes unnecessary to consider an interference between the correction plate 80 and the shielding member 9. Since the distance between the lower end of the shielding member 9 and the workpiece W is precisely adjusted, the distance between the correction plate 80 and the workpiece W can precisely be a constant value. This enables the correction plate 80 to block the film formation materials by an aimed amount.

Figure 16:
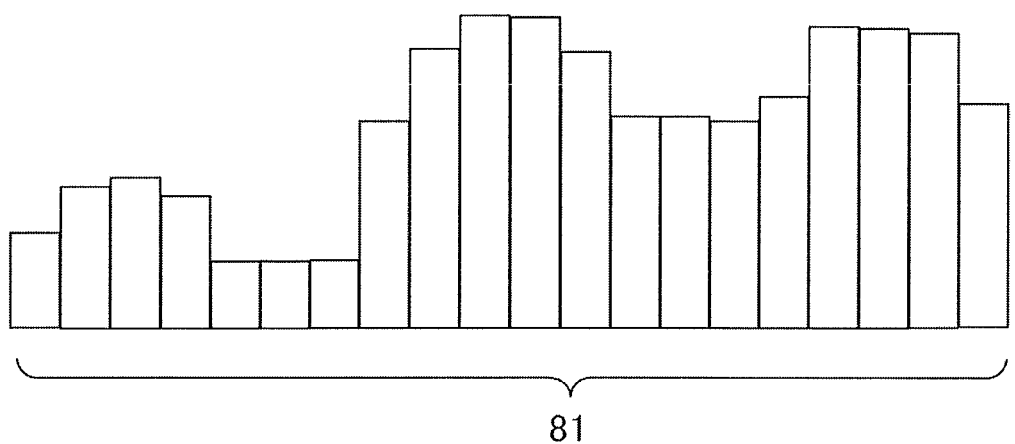
FIG. 16 is an explanatory diagram illustrating an example case in which the correction plate is constructed by a combination of divided components.

As illustrated in FIG. 16, the correction plate 80 may be also formed by a plurality of divided components 81 like the above-described adjusting member 70. This facilitates a change of shape so that the location where blocking of the sputter particles is desired and the location where passing of the sputter particles is desired can be arranged at desired locations, respectively. By forming the correction plate 80 by a combination of the plurality of the dividing components 81, a change in film thickness distribution between the initial stage of the film formation and the latter stage thereof caused by the shape change of the target 61 due to erosion thereof, etc., can be addressed.

(10) Although the embodiment of the present disclosure and the modified example of each component have been described above, such embodiment and modified example of each component are merely presented as examples, and are not intended to limit the scope of the present disclosure. The above-described novel embodiment can be carried out in other various forms, and various omissions, replacements, and modifications can be made thereto without departing from the scope of the present disclosure. Such embodiments and the modified form thereof are within the scope of the present disclosure, and is also within the scope of the invention as recited in the claims. How to combine the invention as recited in the claims is optional. For example, the combination may be made by selecting any features of the above-described embodiment and modified examples (1) to (8), or any feature may be omitted. For example, any of the vibration absorber 30, the vibration absorber 31, and the heat dissipating member 40 of the modified examples (1), (2) and (3) may be applied to the modified example (4), or the vibration absorber 30 in the modified examples (2) and (3) may be omitted. The modified examples (5), (6), (7) and (8) may be applied to any of the embodiment, and the modified examples (1), (2), (3) and (4).

What is claimed is:

1. A film formation apparatus comprising:
    a chamber which has an interior capable of being vacuumed, and which comprises a lid that is openable and closable on an upper part of the chamber;
    a carrying unit which is provided in the chamber and which comprises a rotation table holding workpieces and a rotation shaft that carries the workpieces in a circular trajectory while rotating around the rotation shaft as a center;
    a film formation unit that deposit a film formation material by sputtering on the workpiece carried by the carrying unit to form a film;
    a shielding member which is provided with an opening at a side which the workpiece passes through, and which forms a film formation room where the film formation by the film formation unit is performed; and
    a support which supports the shielding member, and which is immovable relative to the chamber and independent from the lid, wherein
    the support includes an outer-circumference support and an inner-circumference support,
    the outer-circumference support that supports the shielding member at an outer circumference side of the rotation of the carrying unit,
    the inner-circumference support that supports the shielding member at an inner circumference side of the rotation of the carrying unit,
    the inner-circumference support includes a supporting pillar which supports the rotation shaft, and which is immovable relative to the chamber, and
    a clearance that allows the workpiece on the rotating rotation table to pass through is formed between lower ends of the opening of the shielding member and the rotation table.

2. The film formation apparatus according to claim 1, further comprising a first vibration absorber provided between the shielding member and the support.

3. The film formation apparatus according to claim 1, further comprising a second vibration absorber provided between the shielding member and the lid.

4. The film formation apparatus according to claim 1, further comprising a heat dissipating member provided between the shielding member and the lid.

5. The film formation apparatus according to claim 1, wherein the shielding member comprises:
    a ceiling attached to the lid; and
    a side surface provided separately from the ceiling.

6. The film formation apparatus according to claim 1, further comprising an adjusting member which is freely detachably attached to the shielding member, and which adjusts a clearance between the shielding member and the workpiece.

7. The film formation apparatus according to claim 6, wherein the adjusting member comprises a combination of a plurality of divided components.

8. The film formation apparatus according to claim 1, further comprising a correction plate which is freely detachably attached to the shielding member, and which adjusts a film thickness distribution of a film to be formed.

9. The film formation apparatus according to claim 1, wherein the rotation shaft passes through the bottom of the chamber and stands in the chamber.

* * * * *